(12) United States Patent
Kasai

(10) Patent No.: US 7,102,808 B2
(45) Date of Patent: Sep. 5, 2006

(54) MEMS DEVICE AND METHODS FOR MANUFACTURING THEREOF, LIGHT MODULATION DEVICE, GLV DEVICE AND METHODS FOR MANUFACTURING THEREOF, AND LASER DISPLAY

(75) Inventor: Hiroto Kasai, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/474,959

(22) PCT Filed: Feb. 17, 2003

(86) PCT No.: PCT/JP03/01659

§ 371 (c)(1),
(2), (4) Date: Oct. 16, 2003

(87) PCT Pub. No.: WO03/071334

PCT Pub. Date: Aug. 28, 2003

(65) Prior Publication Data

US 2004/0150869 A1    Aug. 5, 2004

(30) Foreign Application Priority Data

Feb. 19, 2002    (JP) .............................. 2002-042029

(51) Int. Cl.
*G02B 26/00* (2006.01)
(52) U.S. Cl. ...................................... 359/290; 359/566
(58) Field of Classification Search ................ 359/290, 359/291, 292, 295, 223, 224, 320, 566, 572, 359/573

See application file for complete search history.

(56) References Cited

U.S. PATENT DOCUMENTS

| | | | | |
|---|---|---|---|---|
| 5,222,071 A | * | 6/1993 | Pezeshki et al. | ............... 372/26 |
| 5,488,862 A | | 2/1996 | Neukermans et al. | |
| 5,725,729 A | | 3/1998 | Greiff | |
| 5,914,480 A | * | 6/1999 | Swartz | ................... 235/472.01 |
| 5,978,127 A | * | 11/1999 | Berg | ........................... 359/279 |
| 5,982,553 A | | 11/1999 | Bloom et al. | |

(Continued)

FOREIGN PATENT DOCUMENTS

EP    1 010 995 A1    6/2000

(Continued)

OTHER PUBLICATIONS

European Search Report, Application No.: 03706951.5-2217 PCT/JP0301659, dated Jul. 12, 2005.

*Primary Examiner*—Hung Xuan Dang
*Assistant Examiner*—Tuyen Tra
(74) *Attorney, Agent, or Firm*—Rader, Fishman & Grauer PLLC; Ronald P. Kananen

(57) ABSTRACT

The present invention provides a MEMS device and methods for manufacturing thereof, in which planarizing the surface of a beam and improving performance of the MEMS device are aimed. In addition, the present invention provides a light modulation device and a GLV device in which this MEMS device is used, and methods for manufacturing thereof; and further, a laser display using this GLV device. According to the present invention, a MEMS device includes a substrate side electrode and a beam that is disposed so as to oppose the substrate side electrode and is driven by electrostatic attraction force or electrostatic repulsion force that acts between the substrate side electrode and the driving side electrode, with the substrate side electrode being formed of a single-crystalline semiconductor layer.

6 Claims, 15 Drawing Sheets

U.S. PATENT DOCUMENTS

| | | | |
|---|---|---|---|
| 6,147,789 A * | 11/2000 | Gelbart | 359/231 |
| 6,172,797 B1 * | 1/2001 | Huibers | 359/291 |
| 6,215,579 B1 * | 4/2001 | Bloom et al. | 359/298 |
| 6,236,491 B1 * | 5/2001 | Goodwin-Johansson | 359/291 |
| 6,721,473 B1 * | 4/2004 | Islam et al. | 385/18 |
| 6,820,988 B1 * | 11/2004 | van Drieenhuizen et al. | 359/872 |
| 6,825,967 B1 * | 11/2004 | Chong et al. | 359/290 |
| 6,940,631 B1 * | 9/2005 | Ishikawa | 359/291 |
| 2002/0118429 A1 | 8/2002 | Miyajima et al. | |

FOREIGN PATENT DOCUMENTS

| | | |
|---|---|---|
| EP | 1 139 159 A2 | 10/2001 |
| EP | 1 215 518 A1 | 6/2002 |
| JP | 2000-513114 | 10/2000 |
| JP | 2002-182136 A1 | 6/2002 |
| JP | 2002-341269 A1 | 11/2002 |
| JP | 2004102150 A * | 4/2004 |
| WO | WO 91/05284 | 4/1991 |
| WO | WO 02/05464 A1 | 9/1998 |
| WO | WO 98/41893 A1 | 9/1998 |

* cited by examiner

MEMS DEVICE AND METHODS FOR MANUFACTURING THEREOF, LIGHT MODULATION DEVICE, GLV DEVICE AND METHODS FOR MANUFACTURING THEREOF, AND LASER DISPLAY

TECHNICAL FIELD

The present invention relates to an electrostatic drive type MEMS device and methods for manufacturing thereof, a GLV device and methods for manufacturing thereof, a light modulation device, and a laser display.

BACKGROUND ART

With the advances in microscopic manufacturing technology, much attention has been focused on so-called micromachine (MEMS: Micro Electro Mechanical Systems, ultraminiature electric, mechanical compound) devices and miniature devices in which MEMS devices are incorporated.

A MEMS device is a device that is formed as a microscopic structure on a substrate, with an insulation film, which is formed on a semiconductor substrate made of silicon (Si), gallium arsenic (GaAs), or the like; or on an insulative substrate such as a glass substrate, a quartz substrate, or the like; in which a driving body outputting mechanical driving force and a semiconductor integrated circuit or the like that controls the mechanical body are electrically united. A basic feature of the MEMS device is such that a mechanically structured driving body is incorporated into a part of the device, and the driving body is electrically driven by the use of coulombic attraction force or the like between electrodes.

FIGS. 13 and 14 show typical compositions of an optical MEMS device that is applied to an optical switch and a light modulation device by taking advantage of the reflection or diffraction of light.

An optical MEMS device 1 shown in FIG. 13 includes a substrate 2, a substrate side electrode 3 formed on the substrate 2, a beam 6 having a driving side electrode 4 that is disposed in parallel to oppose the substrate side electrode 3, and a support part 7 for supporting one end of the beam 6. The beam 6 and substrate side electrode 3 are electrically insulated by a void 8 therebetween.

A required substrate, such as a substrate with an insulation film formed on a semiconductor substrate of, for example, silicon (Si), gallium arsenic (GaAs) and the like or an insulative substrate such as a glass substrate or a quartz substrate is used for the substrate 2. The substrate side electrode 3 is formed of a polycrystalline silicon film by doping impurities therein, metal film (Cr deposited film, for example), and the like. The beam 6 is composed of, for example, an insulation film 5 such as silicon nitride film (SiN film) or the like and the driving side electrode 4 serving as a reflective film consisting of, for example, Al film of about 100 nm in thickness. The beam 6 is formed in a so-called cantilever fashion with its one end supported by the support part 7.

In the optical MEMS device 1, the beam 6 displaces itself in response to electrostatic attraction force or electrostatic repulsion force generated between the substrate side electrode 3 and driving side electrode 4 by an electric potential that is applied to the substrate side electrode 3 and driving side electrode 4, and as shown by a solid line as well as broken line in FIG. 13, for example, the beam 6 displaces itself into a parallel state or inclined state relative to the substrate side electrode 3.

An optical MEMS device 11 shown in FIG. 14 is composed of a substrate 12, a substrate side electrode 13 formed on the substrate 12 and a beam 14 that straddles the substrate side electrode 13 in a bridge-like fashion. The beam 14 and substrate side electrode 13 are insulated by a void 17 therebetween.

The beam 14 is composed of a bridge member 15 of, for example, a SiN film, that rises up from the substrate 12 and straddles a substrate side electrode 13 in a bridge-like fashion and a driving side electrode 16 of, for example, an Al film of about 100 nm in thickness, that, serving as a reflective film, is provided on the bridge member 15 to oppose the substrate side electrode 13 in parallel to each other. The substrate 12, substrate side electrode 13, beam 14 and others may employ similar compositions and materials those explained in FIG. 13. The beam 14 is formed in a so-called bridge-like fashion in which the both end thereof are supported.

In the optical MEMS device 11, the beam 14 displaces itself in response to electrostatic attraction force or electrostatic repulsion force generated between the substrate side electrode 13 and driving side electrode 16 by an electric potential that is applied to the substrate side electrode 13 and driving side electrode 16, and as shown by a solid line and a broken line as well in FIG. 14, for example, the beam 14 displaces itself into a parallel state or fallen state relative to the substrate side electrode 13.

With these optical MEMS devices 1, 11, light is irradiated on the surfaces of the driving side electrodes 4, 16 serving as a light reflective film, and by taking advantage of differences in the direction of reflected light depending upon positions into which the beams 6, 14 are driven, these MEMS devices can be applied to an optical switch having a switch function of detecting the reflected light in one direction.

Further, the optical MEMS devices 1, 11 are applicable as a light modulation device for modulating the strength of light. When light reflection is taken advantage of, the strength of light is modulated by vibrating the beams 6, 14 according to the amount of reflected light in one direction per unit time. This light modulation device runs on a so-called time modulation.

When light diffraction is taken advantage of, a light modulation device is composed of a plurality of beams 6, 14 disposed in parallel relative to the common substrate side electrodes 3, 13, and by varying the height of, for example, driving side electrodes each serving as a light reflective film with the movements of every other beam 6, 14 such as moving closer to or moving away from the common substrate side electrodes 3, 13, the strength of reflected light from the driving side electrodes is modulated by means of light diffraction. This light modulation device runs on a so-called space modulation.

FIGS. 15 and 16 show a conventional method for manufacturing a MEMS device. Those figures show the case in which the method is applied to the above-mentioned MEMS device 11 having the beam in bridge fashion, which is illustrated in FIG. 14.

First, as shown in FIG. 15A, a single-crystalline silicon substrate 31 is prepared. Next, as shown in FIG. 15B, an insulation film 32 is formed on a main surface of the substrate 31 to insulate the substrate from a substrate side electrode which is formed later on. For example, a thermal oxide film ($SiO_2$ film) 32 is formed by heat treatment at 950° C. in the oxygen atmosphere.

Then, as shown in FIG. 15C, on the insulation film 32 a conductive film 33 is formed, which becomes the substrate side electrode formed of, for example, a poly-crystalline silicon film or a non-crystalline silicon film. For example, after forming an intrinsic poly-crystalline silicon film or intrinsic non-crystalline silicon film using silane ($SiH_4$), hydrogen ($H_2$) gas by means of a low-pressure CVD method, an activating process is conducted by ion implantation or by thermal diffusion, of phosphor (P). Alternatively, the conductive film 33 is directly formed by adding phosphine ($PH_3$) when forming a film.

Next, as shown in FIG. 15D, the conductive film 33 is subjected to patterning so as to form a substrate side electrode 13.

Then, as shown in FIG. 15E, a thermal oxide ($SiO_2$) film 34 is formed on the entire surface so as to cover the substrate side electrode 13. The thermal oxide film 34 is, for example, formed by heat treatment at 950° C. in the oxygen atmosphere. At this time, crystal growth of poly-crystalline or non-crystalline silicon of the underlaid substrate side electrode 13 is accelerated, so that the surface unevenness of the thermal oxide film 34 becomes large.

Next, as shown in FIG. 16A, a sacrificial layer 35 of, for example, a non-crystalline silicon film for forming a void is formed on the overall surface of the thermal oxide film 34.

Next, as shown in FIG. 16B, the sacrificial layer 35 is subjected to patterning such that a portion corresponding to the substrate side electrode 13 is left intact while the other portion is removed.

Next, as shown in FIG. 16C, a bridge member 15 made of, for example, a silicon nitride (SiN) film is formed, followed by selectively forming a drive side electrode 16 made of, for example, Al on the portion corresponding to the substrate side electrode 13 of the bridge member 15 so as to form a bridge-like beam 14.

Next, as shown in FIG. 16D, the sacrificial layer 35 is removed so as to form a void 17 between the substrate side electrode 13 and beam 14, and consequently an electrostatic drive type MEMS device 11 is obtained.

Ultimately, the MEMS device 11 has come to have, as relative roughness of the film surface of the drive side electrode 16 of the beam 14, the surface relative roughness reflecting all of the unevenness at the time of forming the substrate side electrode 13, the unevenness that grew at the time of forming the thermal oxide film 34, and the unevenness of the uppermost surface of the Al film (drive side electrode 16) itself.

FIG. 17 shows a composition of a GLV (Grating Light Valve) device developed by SLM (Silicon Light Machines) as a light strength modulation device for a laser display, that is, as a light modulator.

In a GLV device 21, as shown in FIG. 17A, a common substrate side electrode 23 made of a Cr thin film is formed on an insulative substrate 22 such as a glass substrate or the like, and a plurality of beams 24, in this example, six beams 24 [$24_1$, $24_2$, $24_3$, $24_4$, $24_5$, $24_6$] straddling across the substrate side electrodes 23 in a bridge-like fashion are disposed in parallel. The compositions of the substrate side electrode 23 and beams 24 are the same as those explained in above-described FIG. 14. Namely, as shown in FIG. 17B, a reflective film cum driving side electrode 26 made of an Al film of about 100 nm in thickness is formed on the surface, which is parallel to the substrate side electrode 23, of a bridge member 25 made of a SiN film, for example.

The beam 24 made of the bridge member 25 and reflective film cum driving side electrode 26 provided thereon is a portion so-called a ribbon.

The aluminum film (Al film) used as the reflective film cum driving side electrode 26 is a suitable metal as the material for optical components because of the following reasons: (1) it is a metal that can be comparatively easily formed into a film; (2) the dispersion of reflectance with respect to wavelengths in a visible light range is small; (3) alumina natural oxidation film generated on the surface of the Al film functions as a protective film to protect a reflective surface.

Further, the SiN film (silicon nitride film) composing the bridge member 25 is a SiN film formed by means of the low-pressure CVD method, and the SiN film is selected by reason of the physical values of its strength, elasticity constant, and the like being suitable for mechanically driving the bridge member 25.

When a voltage is applied between the substrate side electrode 23 and reflective film cum driving side electrode 26, the above-mentioned beam 24 moves closer to the substrate side electrode 23 according to the above-mentioned electrostatic phenomenon, and when the application of the voltage is stopped, the beam 24 moves away from the substrate side electrode 23 and returns to an original position.

The GLV device 21 alternately varies the height of the reflective film cum driving side electrode 26 with the movements of the plurality of beams 24 (that is, those of every other beams) such as moving closer to or moving away from the substrate side electrode 23, and modulates the strength of light reflected on the driving side electrode 26 by means of the diffraction of light (one beam spot is irradiated on the whole of six beams 24).

Mechanical characteristics of the beam driven by taking advantage of electrostatic attraction force and electrostatic repulsion force are almost predicated on the physical properties of the SiN film formed by the use of the CVD method or the like, with an Al film mainly functioning as a mirror.

Then, it is extremely important, for the optical MEMS device that takes advantage of the reflection and diffraction of light, to control the relative roughness (RMS) of the film surface of the light reflective film cum driving side electrode. Because, the device's characteristics deteriorate as light reflection and light diffraction efficiencies decline according to film surface unevenness.

The substrate side electrode of the MEMS device is formed on a required substrate, such as a substrate with an insulation layer formed on a semiconductor made of, for example, silicon, GaAs, or the like, or an insulative substrate like a quartz substrate or a glass substrate, for example. As for materials thereof, a poly-crystalline film or a metal film in which impurities are doped is conventionally used. However, at a time of forming these films, crystalline grains are generated and as a consequence, there occurs unevenness representing the thickness of the film and crystalline grains on the surface.

For example, a poly-crystalline silicon film is conventionally formed by means of the chemical vapor deposition method (CVD method); however, it has been known that the size of crystalline grains greatly differs from about several tens nm to about several μm depending on the temperature of atmosphere. When a film of 300 nm in the thickness is formed at 650° C. by the use of, for example, the low-pressure CVD method, crystalline grains of 500 nm to 1 μm or so are generated, and at that time the relative roughness (RMS) value of the surface of the substrate side electrode becomes more than 10 nm. The relative roughness of the surface of the substrate side electrode sequentially affects upper layers in the subsequent film forming process and transcribed to the film surface of the optically important driving side electrode in an expanded fashion. Ultimately, a light reflective film cum driving side electrode having piled-up surface unevenness is manufactured.

When formed under the condition of low temperature below 600° C., a non-crystalline silicon without crystallinity is obtained. In this case, there is virtually no relative roughness caused by a single film, though in the subsequent process, when conditions under high temperature are required, for example, at processes: for forming a thermal oxide film, for activation after impurities are doped, for forming a silicon nitride (SiN) film and the like, non-crystalline silicon crystallizes and becomes a poly-crystalline silicon having crystalline grains. When a plurality of processes are conducted at high temperatures, crystalline growth is accelerated, so that on the surface ultimately the film having unevenness affected by underlaid crystalline layers may be formed.

As mentioned above, when the substrate side electrode is formed of poly-crystalline silicon, surface unevenness is, as shown in FIG. 18, increased and transcribed to the surface of the driving side electrode (Al film) 4 constituting the beam (Al/SiN laminated layer) 6, resulting in the deterioration of the light reflectance of the driving side electrode 4 functioning as a mirror.

For example, with the MEMS device in which aluminum (Al) is made to serve as a reflective film, if the film is an ideal bulk Al film, reflectance of the Al film obtained may possibly be about 92%. However, when a poly-crystalline silicon film is formed as the substrate side electrode, followed by forming an Al film on the uppermost surface, that is to become a light reflective film cum driving side electrode, after the process of, for example, forming a thermal oxide film or a SiN film at high temperature, the reflectance of the beam surface will deteriorate by more than several percentage points, so that there is a case in which only about 85% of the reflectance of the beam surface can barely be obtained. Therefore, as one of the measures to improve the characteristics of the MEMS device, there has been great demand for technology to planarize the relative roughness of the surface, particularly, of the underlaid substrate side electrode.

DISCLOSURE OF THE INVENTION

The present invention provides a MEMS device that aims at planarizing the surface of a beam and at improving its performance, and methods for manufacturing the MEMS device; a light modulation device and a GLV device, and methods for manufacturing thereof, and a laser display.

A MEMS device according to the present invention includes a substrate side electrode, and a beam that is disposed to oppose the substrate side electrode and has a driving side electrode driven by electrostatic attraction force or electrostatic repulsion force that acts between the substrate side electrode and the driving side electrode, with the substrate side electrode being formed of a single-crystalline semiconductor layer.

A method for manufacturing the MEMS device according to the present invention has the processes of: forming a substrate side electrode made of a single-crystalline semiconductor layer on the insulated surface of a substrate, selectively forming a sacrificial layer including the upper part of the substrate side electrode through or not through an insulation film, forming a beam having a driving side electrode on the sacrificial layer, and removing the sacrificial layer.

In the above-mentioned MEMS device, the substrate side electrode can be formed of single-crystalline semiconductor layer formed on the insulated surface of the substrate. The substrate side electrode can be formed of an epitaxial growth layer that grows on the insulated surface of the substrate. Using an SOI substrate having the single-crystalline semiconductor layer on a semiconductor substrate through an insulation film, the substrate side electrode can be formed of this single-crystalline semiconductor layer.

In the MEMS device according to the present invention, since the substrate side electrode is formed of a single-crystalline semiconductor layer, the surface thereof is maintained as that of the single-crystalline semiconductor layer, that is, maintained as an extremely planarized one of a mirror surface. Therefore, the surface and reverse surface of the beam ultimately obtained by sequentially forming a sacrificial layer, beam and the like on the substrate side electrode are planarized. When a driving side electrode is used as a light reflective film, light reflectance on the surface of the driving side electrode is improved.

In a method for manufacturing a MEMS device according to the present invention, since a substrate side electrode is formed of a single-crystalline semiconductor layer, the planarity of the surfaces of a sacrificial layer and a beam that are subsequently formed can be maintained, and as a result, it is possible to easily and accurately manufacture the MEMS device having the beam the surface of which is ultimately planarized.

A light modulation device according to the present invention includes a substrate side electrode, and a beam that is disposed to oppose the substrate side electrode and has a driving side electrode driven by electrostatic attraction force or electrostatic repulsion force acting between the substrate side electrode and the driving side electrode, with the substrate side electrode being formed of a single-crystalline semiconductor layer.

In the above-mentioned light modulation device, the substrate side electrode can be formed of a single-crystalline semiconductor layer formed on an insulated surface of a substrate. The substrate side electrode can be formed of an epitaxial growth layer that grows on the insulated surface of the substrate. Using an SOI substrate having the single-crystalline semiconductor layer on a semiconductor substrate through an insulation film, the substrate side electrode can be formed of this single-crystalline semiconductor layer.

With a light modulation device according to the present invention, since a substrate side electrode is formed of a single-crystalline semiconductor layer, the surface thereof is maintained as that of a single-crystalline semiconductor substrate, that is, extremely planarized one of a mirror surface. Therefore, as described above, the ultimately obtained light reflecting surface of a light reflective film cum driving side electrode of a beam is planarized, thereby light reflectance as well as light use efficiency being improved.

A GLV device according to the present invention includes a common substrate side electrode and a plurality of beams that are independently disposed in parallel to each other to oppose the common substrate side electrode and that each have light reflective film cum driving side electrodes driven by electrostatic attraction force or electrostatic repulsion force that acts between the substrate side electrode and the driving side electrodes, with the substrate side electrode being formed of a single-crystalline semiconductor layer.

A method for manufacturing a GLV device of the present invention has the processes of: forming a common substrate side electrode made of a single-crystalline semiconductor layer on the insulation film of a substrate, selectively forming a sacrificial layer including the upper part of the substrate side electrode through or not through the insulation film, forming a plurality of beams having light reflective film cum driving side electrodes independently disposed in parallel to each other on the sacrificial layer, and removing the sacrificial layer.

In the above-mentioned GLV device, the common substrate side electrode can be formed of a single-crystalline semiconductor layer formed on the insulated surface of the substrate. The common substrate side electrode can be formed of an epitaxial growth layer that grows on the insulated surface of the substrate. Using an SOI substrate having the single-crystalline semiconductor layer on a semiconductor substrate through an insulation film, the common substrate side electrode can be formed of this single-crystalline semiconductor layer.

With a GLV device according to the present invention, since a substrate side electrode is formed of a single-crystalline semiconductor layer, the surface thereof is maintained as that of the single-crystalline semiconductor layer, that is, extremely planarized one of a mirror surface. Therefore, as described above, the ultimately obtained light reflecting surface of a light reflective film cum driving side electrode of a beam is planarized, thereby light reflectance being improved as well as light use efficiency.

According to a method for manufacturing a GLV device of the present invention, since a common substrate side electrode is formed of a single-crystalline semiconductor layer, the surfaces of a sacrificial layer and a beam that are subsequently formed are maintained to be planarized, making it possible to easily and accurately manufacture the GLV device having a beam, the surface of which is ultimately planarized.

A laser display according to the present invention includes: a laser light source and a GLV device that is disposed on the optical axis of a laser light beam emitted from the laser light source and modulates the strength of the laser light beam, in which the GLV device is composed of a common substrate side electrode, a plurality of beams that are independently disposed in parallel to each other to oppose the common substrate side electrodes and each have light reflective film cum driving side electrodes driven by electrostatic attraction force or electrostatic repulsion force acting between the substrate side electrode and the driving side electrodes, with the substrate side electrode being formed of a single-crystalline semiconductor layer.

With a laser display according to the present invention, since a substrate side electrode is formed of a single-crystalline conductive semiconductor layer in a GLV device that modulates the strength of a laser light beam, the surfaces of light reflective film cum driving side electrodes of a plurality of beams are planarized, as described above. Therefore, light reflectance is improved, and light use efficiency in the laser display improves.

According to a MEMS device of the present invention, since a substrate side electrode is formed of a single-crystalline semiconductor layer so as to maintain the relative roughness of the surface of the substrate side electrode equivalent to the mirror surface level of a single-crystalline semiconductor layer, obvious unevenness on the surface of a driving side electrode of a beam can be planarized. As a result, the characteristics and performance of the MEMS device can be improved. When using an SOI substrate the substrate side electrode is formed of its single-crystalline semiconductor layer, since the relative roughness of the surface of the substrate side electrode is maintained at a mirror surface level thereof, the surface of the driving side electrode of the beam can be planarized. When the substrate side electrode is formed of an epitaxial growth layer, since the surface of the substrate side electrode is maintained at a mirror surface level, the surface of the driving side electrode of the beam can be planarized. When the substrate side electrode is formed of a single-crystalline semiconductor layer formed on the insulated surface of a beam, since the surface of the substrate side electrode is maintained at a mirror surface level, the surface of the driving side electrode of the beam can be planarized.

According to a method for manufacturing a MEMS device of the present invention, it is possible to manufacture the above-mentioned MEMS devices easily and accurately.

When the MEMS devices of the present invention is applied to a light modulation device utilizing the reflection or diffraction of light, since the surface of a light reflective film cum driving side electrode is planarized, efficiencies in light reflectance and light diffraction are improved to increase light use efficiency, and improvements in the characteristics and performance of the light modulation device can be implemented.

When a GLV device is composed of a light modulation device of the present invention, it is possible to provide the GLV device that utilizes light in high efficiency and has characteristics and performance that are improved.

According to a method for manufacturing a GLV device of the present invention, the above-mentioned GLV device can be easily and accurately manufactured.

When a GLV device of the present invention is incorporated in a laser display, it is possible to provide the laser display that utilizes light in high efficiency, has characteristics and performance that are improved.

BEST MODE FOR CARRYING OUT THE INVENTION

Hereinafter, embodiments of the present invention will be explained with reference to drawings.

Figure 1:
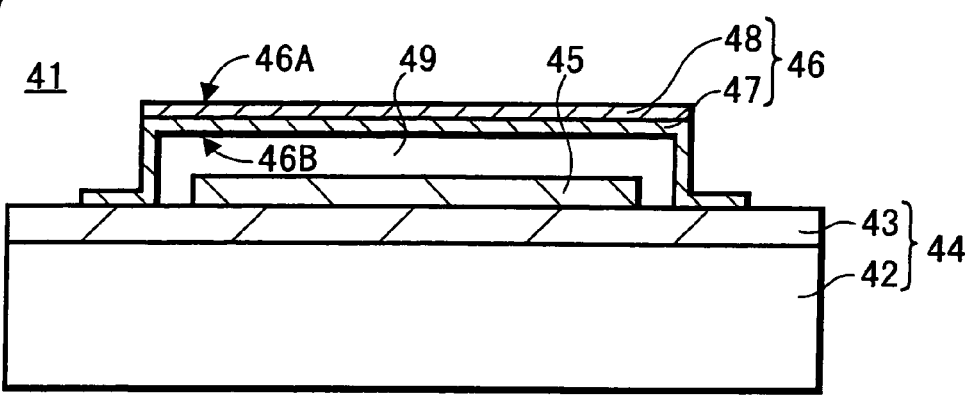
FIG. 1 is a structural diagram showing a typical embodiment of a MEMS device according to the present invention.

FIG. 1 shows one typical embodiment of an electrostatic drive type MEMS device according to the present invention.

A MEMS device 41 according to the present invention is composed in the following manner. There is provided a substrate with an insulation film formed on a semiconductor base substance, or an insulative substrate made of glass, quartz and the like, and in this embodiment, a base substance 44 of an insulation film 43 formed on a semiconductor substrate 42 is provided. On this insulation film 43 a substrate side electrode 45 made of a single-crystalline semiconductor layer is formed. An electrostatic drive type beam 46 that straddles the substrate side electrode 45 in a bridge-like fashion is disposed so as to oppose the substrate side electrode 45 with a void 49 between the beam and the electrode. The substrate side electrode 45 and the beam 46 are electrically insulated from each other by the void 49 that is formed therebetween.

The beam 46 is composed of a bridge member 47 made of an insulation film that straddles the substrate side electrode 45 in a bridge-like fashion and rises up from the base substance 44, and a driving side electrode 48 provided upon the bridge member 47 in parallel to each other, opposing the substrate side electrode 45. The beam 46 is composed in a so-called bridge-like fashion. Meanwhile, in a part of the MEMS device 41 a semiconductor integrated circuit and the like is incorporated to control driving thereof.

A single-crystalline substrate made of, for example, silicon (Si), gallium arsenic (GaAs), or the like can be used as the semiconductor substrate 42. The insulation film 43 can be composed of, for example, a silicon oxide ($SiO_2$) film. A single-crystalline semiconductor layer that becomes the substrate side electrode 45 can be formed of, for example, a silicon single-crystalline layer. Using an SOI [silicon (semiconductor) on insulator] substrate, the substrate side electrode 45 can be formed of its single-crystalline layer. Further, the substrate side electrode 45 can be formed of an epitaxial growth layer.

The bridge member 47 can be formed of an insulating material, such as a silicon nitride (SiN) film, silicon oxide film ($SiO_2$), in this embodiment, formed of the silicon nitride film ($SiO_2$). The beam 46 can be formed of a laminated film of an insulation film, such as a silicon nitride (SiN) film, silicon oxide film ($SiO_2$), in this embodiment, the silicon nitride film 47 whose physical property values such as strength, elastic constant, and the like are suitable for a mechanical drive of the beam; and a driving side electrode 48 thereupon. As the driving side electrode 48, Ag film, Al film whose main component is aluminum (Al), any one of refractory metal films of titanium Ti, tungsten W, molybdenum Mo, tantalum Ta, and the like can be employed.

Figure 3:
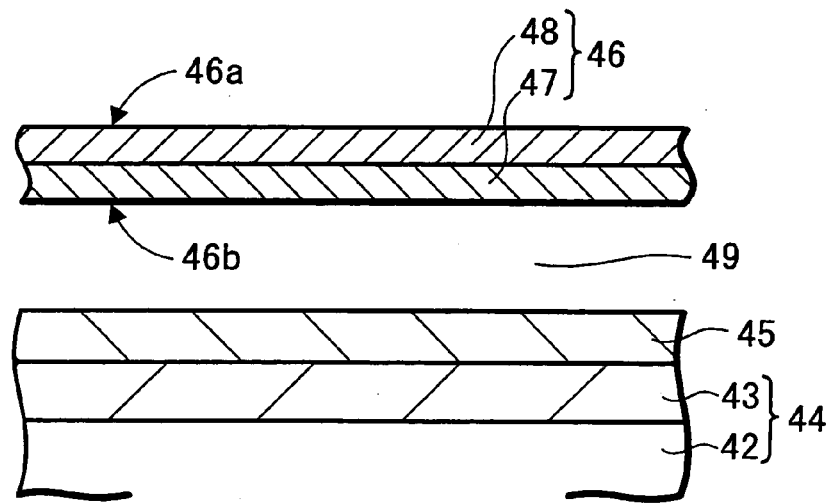
FIG. 3 is a cross-sectional view of a relevant part showing the planarity of a driving side electrode of the MEMS device according to the present invention.

According to the MEMS device 41 of the present invention, since the substrate side electrode 45 is formed of a single-crystalline silicon layer, relative roughness of the surface of the substrate side electrode 45 is maintained at a mirror surface level of the single-crystalline silicon layer, so that the surface is maintained to be extremely planarized. Therefore, in its manufacturing process, even if a sacrificial layer, the bridge member 47 made of an SiN film constituting the beam 46, and the driving side electrode 48 are sequentially formed on the substrate side electrode 45, a surface 46a of the beam 46 and a reverse surface 46b of the beam 46 opposing the substrate side electrode 45 can be planarized. Particularly, the surface 46a on the side of the driving side electrode 48 can attain a planarized surface that is affected only by the unevenness of crystal grains of the film constituting the driving side electrode 48. When the driving side electrode 48 is, for example, formed of an Al film, only the unevenness caused by crystal grains of the Al film affects the surface of the Al film. As a result, as shown in FIG. 3, the driving side electrode 48 having excellent planarity is obtained.

When using an SOI substrate the substrate side electrode 45 is formed of its single-crystalline semiconductor layer, for example, single-crystalline silicon layer, the surface of the substrate side electrode 45 is maintained at a mirror surface level, so that the surface of the driving side electrode 48 of the beam 46 can be planarized.

When the substrate side electrode 45 is also formed of an epitaxial growth layer, since the surface of the substrate side electrode 45 is maintained at a mirror surface level, the surface of the driving side electrode of the beam 46 can be planarized.

When the MEMS device 41 is applied to an optical MEMS device, the surface of the driving side electrode 48 functions as a light reflective surface (so-called mirror surface), which improves efficiencies in reflectance and diffraction of light and increases efficiency in utilizing the reflected light, making it possible to implement improvements in the characteristics and performance of the optical devices such as a light switch capable of performing on-off control, a light modulation device for modulating the strength of light, and the like.

FIG. 4 to FIG. 5 show an embodiment of the method for manufacturing the above-mentioned MEMS device 41.

Figure 4A:
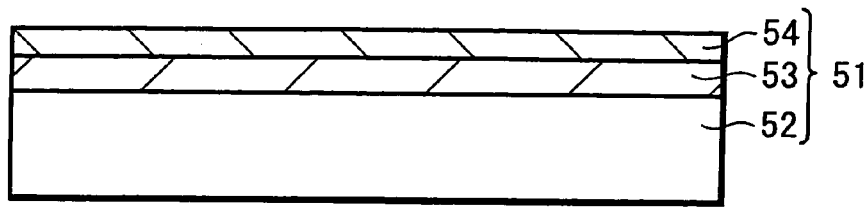
FIGS. 4A to 4E are diagrams showing a manufacturing process (first sequence) of an embodiment of the methods for manufacturing the MEMS device in FIG. 1.

First, as shown in FIG. 4A, a so-called SOI (silicon on insulator) substrate 51 having a single-crystalline silicon layer 54 through an insulation layer, for example, silicon oxide ($SiO_2$) layer 53 on a single-crystalline silicon substrate 52 is prepared. At this point of time, since an underlaid substrate 52 and the single-crystalline silicon layer 54 provided on the surface, which later becomes a substrate side electrode are insulated by the silicon oxide layer 53, there is no need to form an oxide film to insulate the underlaid substrate and the single-crystalline layer.

Figure 4B:
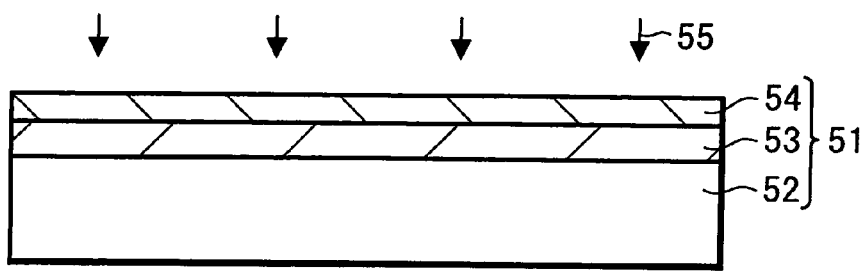

Next, as shown in FIG. 4B, impurities 55 of a first conductive type is doped in the single-crystalline silicon layer 54 functioning as a mirror surface of the surface of the SOI substrate 51, followed by an activating process so as to form the conductive single-crystalline silicon layer 54. In this embodiment, phosphor (P) 55 is doped in the single-crystalline silicon layer 54 by ion implantation or by thermal diffusion, and the layer is subjected to the activating process. The activating process is made by heat treatment under the conditions of high temperature at about 800° C. to 1000° C. Since the silicon layer 54 is made of a single-crystalline layer, the planarity of its surface is maintained at a mirror finished Si surface level.

Figure 4C:
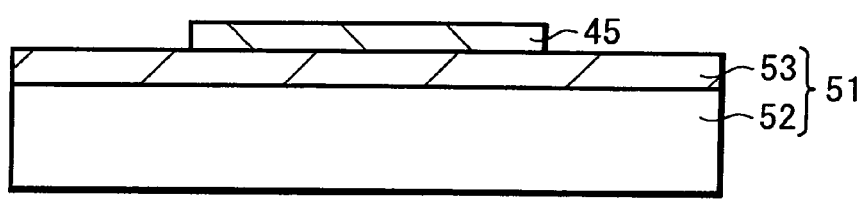
Figure 4D:
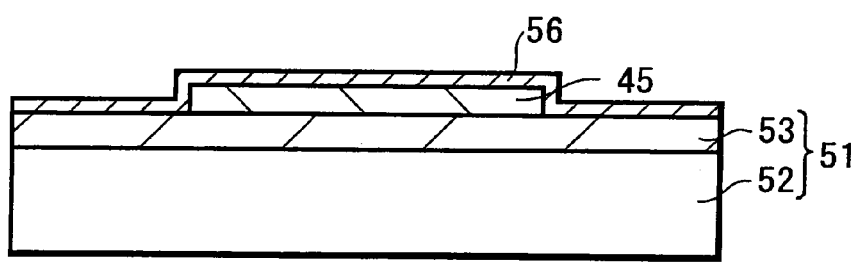

Next, as shown in FIG. 4C, the conductive single-crystalline silicon layer 54 is subjected to patterning so as to form a substrate side electrode 45 made of a single-crystalline silicon layer.

Next, a sacrificial layer for forming a void is formed on the entire surface of the substrate side electrode 45 through or not through an insulation film. In this embodiment, since non-crystalline layer is used as the sacrificial layer, an insulation film functioning as a protective film for the substrate side electrode 45 is formed.

That is, as shown in 4D, a thermal oxide film, for example, thermal oxide film ($SiO_2$ film) 56 is formed in an oxide atmosphere at 950° C. on the entire surface including the surface of the substrate side electrode 45 made of a single-crystalline silicon layer. In this case, since the single-crystalline silicon substrate side electrode 45 is underlaid, unevenness does not occur on the surface of the thermal oxide film 56, so that planarity of the mirror finished Si surface level is maintained.

Figure 4E:
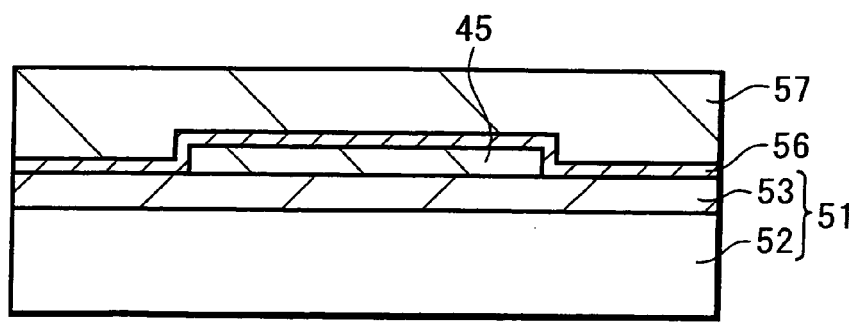

Next, as shown in FIG. 4E, the sacrificial layer for forming the void, in this embodiment, a silicon layer 57 made of a non-crystalline silicon layer is formed across the entire surface. Meanwhile, as the sacrificial layer 57, other than the non-crystalline silicon film, there can be employed a poly-crystalline silicon film, a photoresist film or an insulation film (for example, silicon oxide film, silicon nitride film, or the like) that has an etching rate different from that of a member constituting a beam described later on.

When the substrate side electrode 45 is formed of single-crystalline silicon, and the sacrificial layer 57 is formed of photoresist film, silicon oxide film, silicon nitride film, or the like, the above-mentioned insulation film 56 functioning as a protective film can be omitted.

Figure 5A:
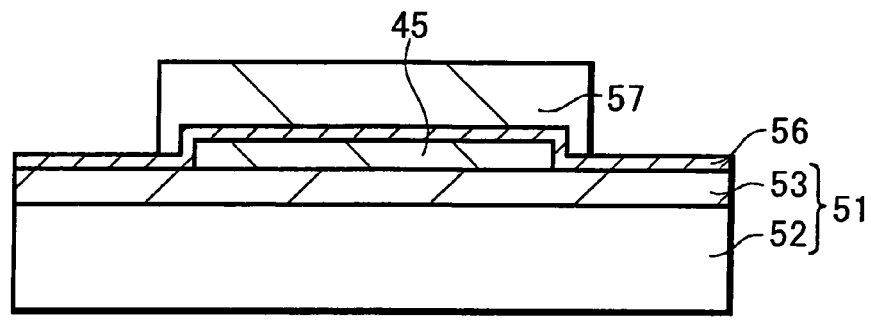
FIGS. 5A to 5C are diagrams showing the manufacturing process (second sequence) of an embodiment of the methods for manufacturing the MEMS device in FIG. 1.

Next, as shown in FIG. 5A, the sacrificial layer 57 is subjected to patterning such that at least the portion above the substrate side electrode 45 of the sacrificial layer 57 is left intact while the other portion thereof is removed. In this embodiment, patterning is performed such that the sacrificial layer 57 remains larger than the substrate side electrode 45 to some extent.

Figure 5B:
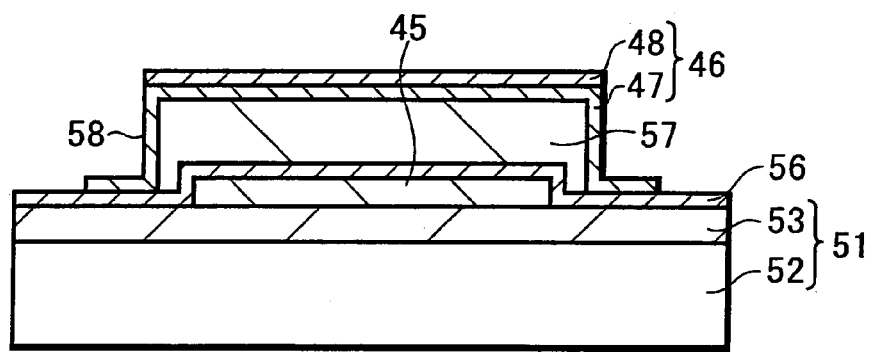

Next, as shown in FIG. 5B, an insulation film, in this embodiment, a silicon nitride film 58 is formed on the insulation layer 53 of the substrate 51 so as to cover the sacrificial layer 57, followed by patterning to form a bridge member 47. Further, a driving side electrode 48 is selectively formed over the portion of the bridge member 47 that is parallel to the substrate side electrode 45, and as a result, the beam 46 is formed.

Figure 5C:
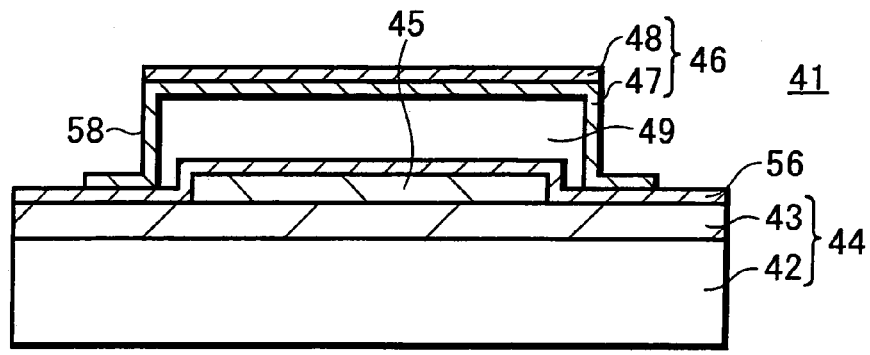

Next, as shown in FIG. 5C, the non-crystalline silicon layer 57 that is a sacrificial layer is removed by gas etching using $XeF_2$ gas to form a void 49 between the substrate side electrode 45 and beam 46, and as a result, an aimed electrostatic drive type MEMS device 41 is obtained.

According to the method for manufacturing the MEMS device 41 of the present invention, using the SOI substrate 51, the impurities 55 are doped in its single-crystalline silicon layer 54 to make the single-crystalline silicon layer 54 having conductivity, so that the substrate side electrode 45 is formed of this single-crystalline silicon layer 54.

Therefore, the surface of the substrate side electrode 45 is maintained at the mirror surface level of the single-crystalline silicon layer 54, and becomes a planarized surface without unevenness. Subsequently, the sacrificial layer 57, the bridge member 47 and a driving side electrode material layer that constitute the beam are sequentially formed, followed by removing the sacrificial layer 57. As a consequence, it is possible to accurately and easily manufacture the MEMS device 41 having the beam 46 in which the driving side electrode 48 is planarized.

Since unevenness is not formed on the surface of the substrate side electrode 45, in subsequent processes at high temperature unevenness of film does not occur, making it possible to form the planarized beam 46. On the contrary, when the substrate side electrode is formed of a non-crystalline silicon film or a poly-crystalline silicon film, there is a possibility that crystal grains further grow and unevenness may occur in a subsequent process at high temperature; however, there is no such concern in this embodiment.

Compared with the conventional manufacturing method shown in FIGS. 15 to 16, since a process of forming an oxide film and a process of forming a conductive layer that becomes the substrate side electrode are not required, and further, the number of masks necessary for the overall process remains unchanged, it is possible to reduce costs for manufacturing the MEMS device.

FIGS. 6 to 7 show another embodiment of the method for manufacturing the above-mentioned MEMS device 41.

Figure 6A:
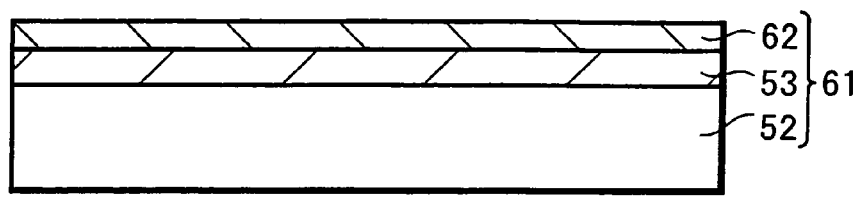
FIGS. 6A to 6D are diagrams showing a manufacturing process (first sequence) of another embodiment of the methods for manufacturing the MEMS device in FIG. 1.

According to this embodiment, as shown in FIG. 6A, there is prepared a so-called SOI (silicon on insulator) substrate 61 having on the single-crystalline silicon substrate 52 a single-crystalline silicon layer (that is, conductive single-crystalline silicon layer) 62 with resistivity at 0.01 to several 10 „cm or so, into which impurities of a first conductive type was already doped through an insulation film, for example, the silicon oxide ($SiO_2$) layer 53. There is no limitation as to whether the inductive type of the single-crystalline silicon layer 62 is a p-type or n-type. Since the underlaid substrate 52 and the single-crystalline silicon layer 62 that later becomes the substrate side electrode are insulated from each other by the silicon oxide layer 53, it is unnecessary to form an oxide film to insulate the underlaid substrate from the single-crystalline silicon layer.

In addition, since the single-crystalline silicon layer 62 on the upper mirror surface of the SOI substrate 61 was already made to have low resistance, the level of which is suitable for an electrode, there is no need to further dope impurities therein.

Figure 6B:
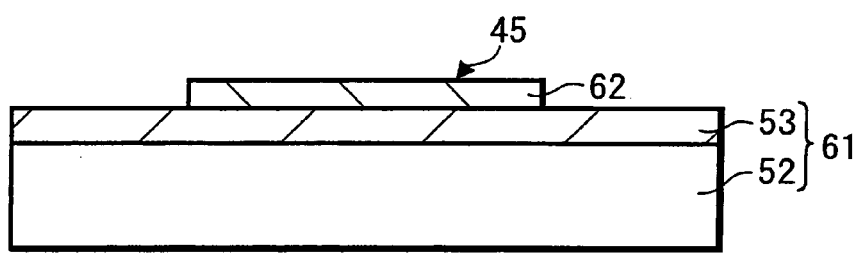
Figure 6C:
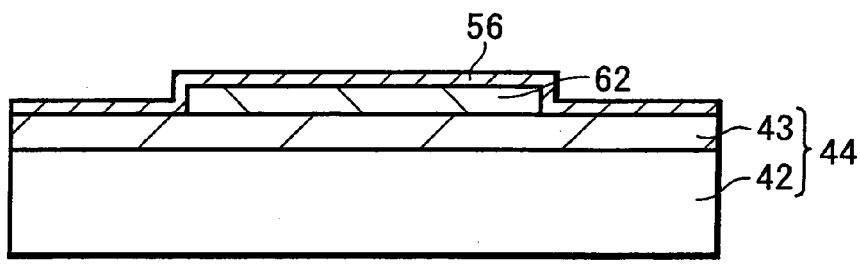
Figure 6D:
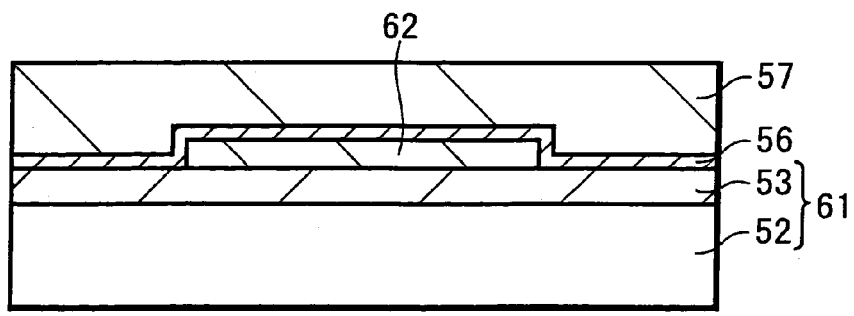

The process on and after FIG. 6B will be the same as those of FIGS. 4C to 5C mentioned above.

Namely, as shown in FIG. 6B, the single-crystalline silicon layer 62 is subjected to patterning so as to form the substrate side electrode 45 made of a single-crystalline silicon layer.

Next, a sacrificial layer for forming a void is formed across the overall surface of the substrate side electrode 45 through or not through an insulation film. In this embodiment, since non-crystalline silicon layer is used as the sacrificial layer, as shown in 6C, a thermal oxide film, for example, the thermal oxide film ($SiO_2$ film) 56 is formed across the overall surface including the surface of the substrate side electrode 45 made of single-crystalline silicon at 950° C. in an oxide atmosphere. At this time, too, since the substrate side electrode 45 made of single-crystalline silicon is underlaid, unevenness does not occur on the thermal oxide film 56, and planarity at a mirror finished Si surface level can be maintained.

Next, as shown in 6D, a sacrificial layer for forming a void, in this embodiment, the sacrificial layer 57 made of the non-crystalline silicon layer is formed across the overall surface in the same manner as mentioned above.

Figure 7A:
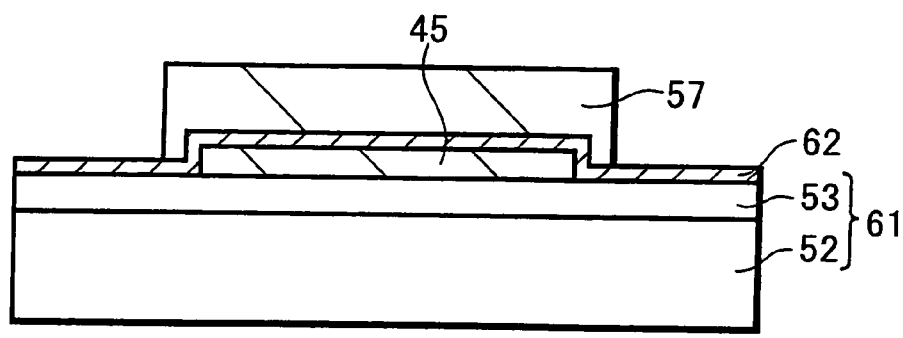
FIGS. 7A to 7C are diagrams showing the manufacturing process (second sequence) of another embodiment of the methods for manufacturing the MEMS device in FIG. 1.

Next, as shown in FIG. 7A, the sacrificial layer 57 is subjected to patterning such that at least the portion above the substrate side electrode 45 is left intact while the other portion is removed. In this embodiment, patterning is performed such that the sacrificial layer 57 remains larger than the substrate side electrode 45 to some extent.

Figure 7B:
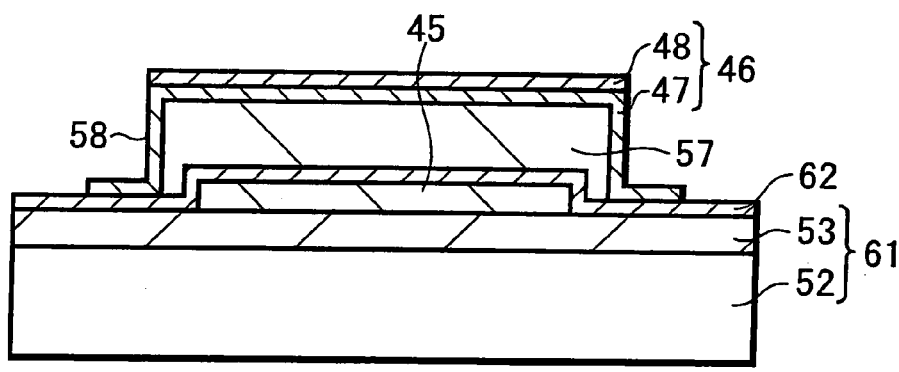

Next, as shown in FIG. 7B, an insulation film, in this embodiment, a silicon nitride film 58 is formed on the insulation film 53 of the substrate 61 so as to cover the sacrificial layer 57, followed by patterning to form a bridge member 47. Further, the driving side electrode 48 is selectively formed over the portion of the bridge member 47 that is parallel to the substrate side electrode 45, and as a result the beam 46 is formed.

Figure 7C:
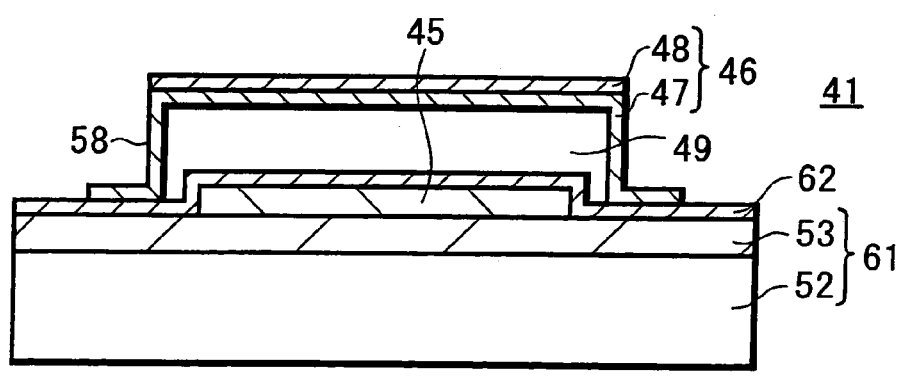

Next, as shown in FIG. 7C, the non-crystalline silicon layer 57 that is a sacrificial layer is removed by gas etching using $XeF_2$ gas to form a void 49 between the substrate side electrode 45 and beam 46. As a result, the aimed electrostatic drive type MEMS device 41 is obtained.

According to the method for manufacturing the MEMS device of the present invention, since using the SOI substrate 61 having the single-crystalline silicon layer 62 in which impurities were already doped the substrate side electrode 45 is formed by its single-crystalline silicon layer 62, the surface of the substrate side electrode 45 is maintained at the mirror surface level of the single-crystalline silicon layer 62 and becomes a planarized surface without unevenness. Subsequently, the sacrificial layer 57, the bridge member 47 and a driving side electrode material layer that constitute the beam, are sequentially formed, followed by removing the sacrificial layer 57. As a consequence, it is possible to accurately and easily manufacture the MEMS device 41 having the beam in which the driving side electrode 48 is planarized. Since unevenness is not formed on the surface of the substrate side electrode 45, in a subsequent process at high temperature unevenness of film does not occur, making it possible to form the beam 46 with a planarized surface.

Compared with the manufacturing method shown in FIGS. 4 to 5, since the process of doping the impurities 55 is not required in this embodiment, the number of processes is further reduced, so that it is possible to reduce costs for manufacturing the MEMS device.

FIGS. 8 to 10 show another embodiment of the method for manufacturing the above-mentioned MEMS device 41.

Figure 8A:
FIGS. 8A to 8D are diagrams showing a manufacturing process (first sequence) of yet another embodiment of the methods for manufacturing the MEMS device in FIG. 1.

First, as shown in FIG. 8A, a single-crystalline silicon substrate 66 is prepared. Alternatively, an insulative substrate made of, such as glass, quartz, alumina, or the like may be used for the substrate 66.

Figure 8B:
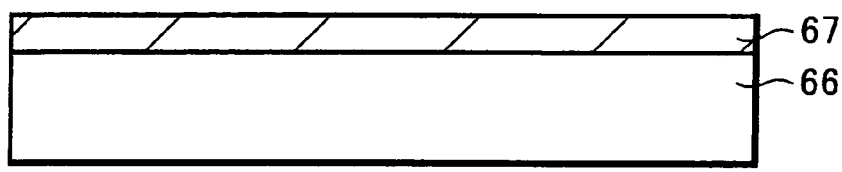
Figure 8C:
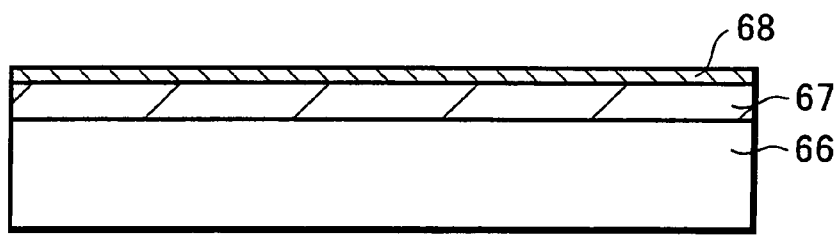

Next, as shown in FIG. 8B, an insulation film 67 is formed on the surface of this single-crystalline substrate 66 to insulate a substrate side electrode subsequently formed. In this embodiment, the thermal oxide film ($SiO_2$ film) 67 is formed at 950° C. in an oxide atmosphere. When an insulative substrate is used, there is no need to form this insulation film 67.

Next, as shown in 8C, a so-called seed layer 68 that functions as a seed for epitaxial growth is formed on the insulation film 67 (on a insulative substrate when the insulative substrate is used). As a material for the seed layer 67 with respect to the silicon (Si) film, for example, carbon, nickel, gallium or the like is efficient. The seed layer 67 is formed of a film having the thickness of about several 10 nm, by means of the CVD method, the sputtering method, or the like.

Figure 8D:
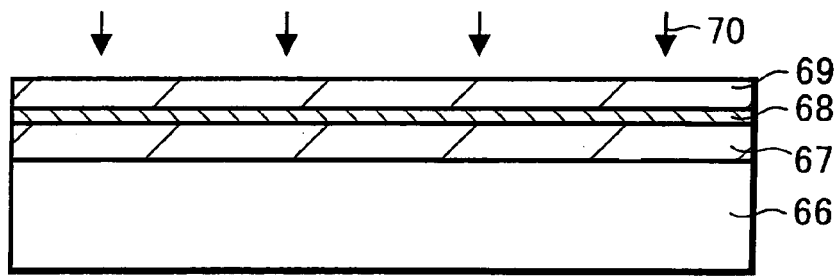

Next, as shown in FIG. 8D, a silicon epitaxial growth layer 69 is formed on the seed layer 68 using epitaxial CVD apparatus. Subsequently, impurities of a first conductive type, for example, phosphor (P) 70 are doped in the epitaxial growth layer 69 by means of ion implantation, thermal diffusion, or the like to form a conductive Si epitaxial growth layer. At this time, the conductive Si epitaxial growth layer 69 may as well be formed by simultaneously adding $PH_3$, in addition to $SiH_4$ and $H_2$ gas, each of which is film forming material gas. In order to obtain planarity of the surface, it is desirable to polish the epitaxial growth layer 69, if necessary.

Figure 9A:
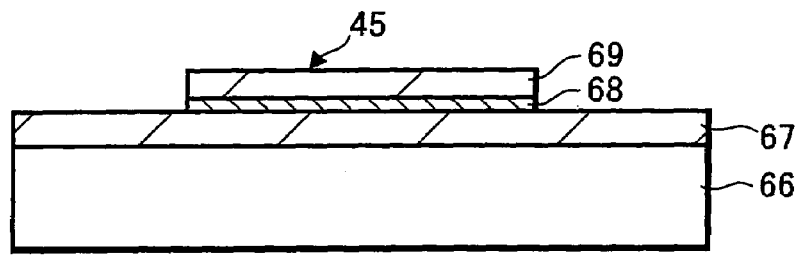
FIGS. 9A to 9D are diagrams showing the manufacturing process. (second sequence) of yet another embodiment of the methods for manufacturing the MEMS device in FIG. 1.

Next, as shown in FIG. 9A, the epitaxial growth layer 69 and the seed layer 68 are subjected to patterning so as to form the substrate side electrode 45 made of the epitaxial growth layer 69.

Figure 9B:
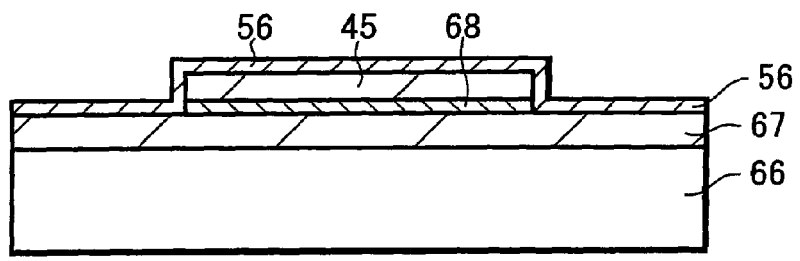

The subsequent process on and after FIG. 9B is the same as that in FIGS. 4D to 5C mentioned above.

Namely, a sacrificial layer for forming a void is formed across the overall surface of the substrate side electrode 45 through or not through an insulation film. In this embodiment, since non-crystalline silicon layer is used as the sacrificial layer, as shown in 9B, a thermal oxide film, for example, the thermal oxide film ($SiO_2$ film) 56 is formed in an oxide atmosphere at 950° C. across the overall surface including the surface of the substrate side electrode 45 made of an epitaxial growth layer. Also at this time, since single-crystalline silicon is underlaid as the substrate side electrode 45, unevenness does not occur on the thermal oxide film 56, so that the planarity at the mirror surface level can be maintained.

Figure 9C:
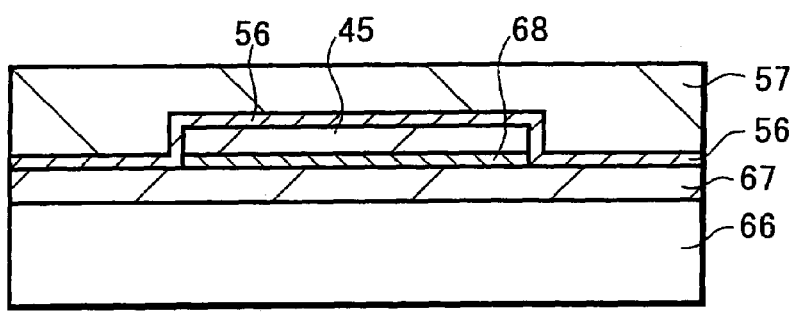

Next, as shown in FIG. 9C, a sacrificial layer for forming a void, in this embodiment, the sacrificial layer 57 made of a non-crystalline silicon layer is formed across the overall surface.

Figure 9D:
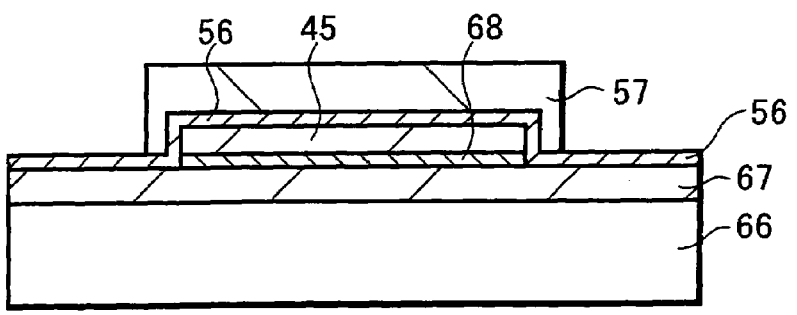

Next, as shown in FIG. 9D, the sacrificial layer 57 is subjected to patterning such that at least the portion above the substrate side electrode 45 is left intact while the other portion is removed. In this embodiment, patterning is performed such that the sacrificial layer 57 remains larger than the substrate side electrode 45 to some extent.

Figure 10A:
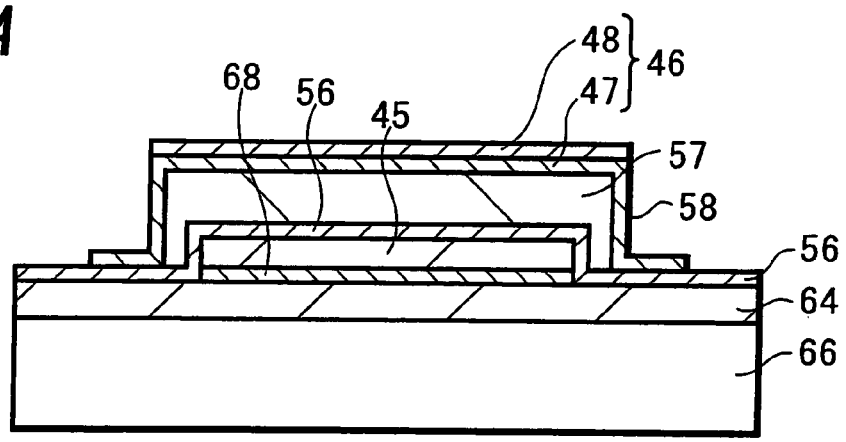
FIGS. 10A and 10B are diagrams showing the manufacturing process (third sequence) of yet another embodiment of the methods for manufacturing the MEMS device in FIG. 1.

Next, as shown in FIG. 10A, an insulation film, in this embodiment, a silicon nitride film 58 is formed on insulation films (64, 56) of the substrate 66 so as to cover the sacrificial layer 57, followed by patterning to form a bridge member 47. Further, the driving side electrode 48 made of, for example, Al is selectively formed over the portion of the bridge member 47 that is parallel to the substrate side electrode 45, and as a result the beam 46 is formed.

Figure 10B:
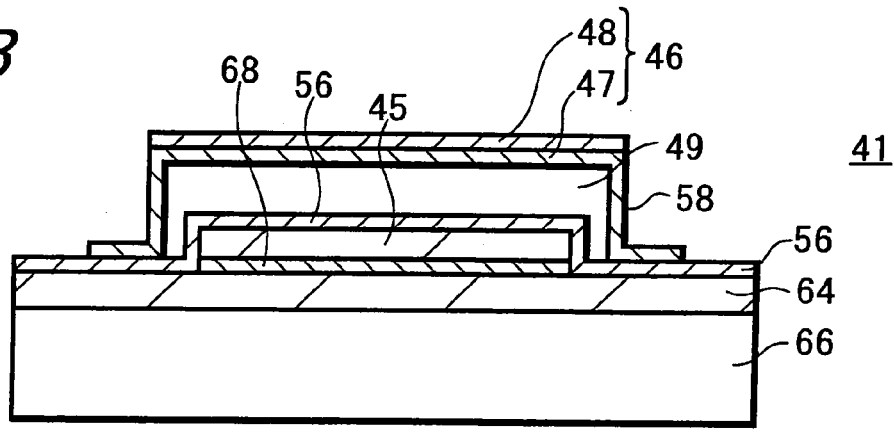

Next, as shown in FIG. 10B, the non-crystalline silicon layer 57 that is the sacrificial layer is removed by gas etching using $XeF_2$ gas to form a void 49 between the substrate side electrode 45 and beam 46. As a result, the aimed electrostatic drive type MEMS device 41 is obtained.

According to the method for manufacturing the MEMS device of the present invention, since the substrate side electrode 45 is formed of the epitaxial growth layer 69, the surface of the substrate side electrode 45 is maintained at the mirror surface level of the epitaxial growth layer 69 and becomes a planarized surface without unevenness. Subsequently, the sacrificial layer 57, the bridge member 47 and a driving side electrode material layer that constitute the beam, are sequentially formed, followed by removing the sacrificial layer 57. As a consequence, it is possible to accurately and easily manufacture the MEMS device 41 having the beam in which the driving side electrode 48 is planarized. Since unevenness is not formed on the surface of the substrate side electrode 45, in a subsequent process at high temperature unevenness of film does not occur, making it possible to form the beam 46 with a planarized surface.

Compared with the conventional manufacturing method shown in FIGS. 15 to 16, since the process of forming an oxide film to be insulated from the substrate, and the process of forming the conductive layer that becomes the substrate side electrode can be reduced; and further, the number of masks necessary for the overall process remains unchanged, it is possible to reduce costs for manufacturing the MEMS device.

Figure 2:
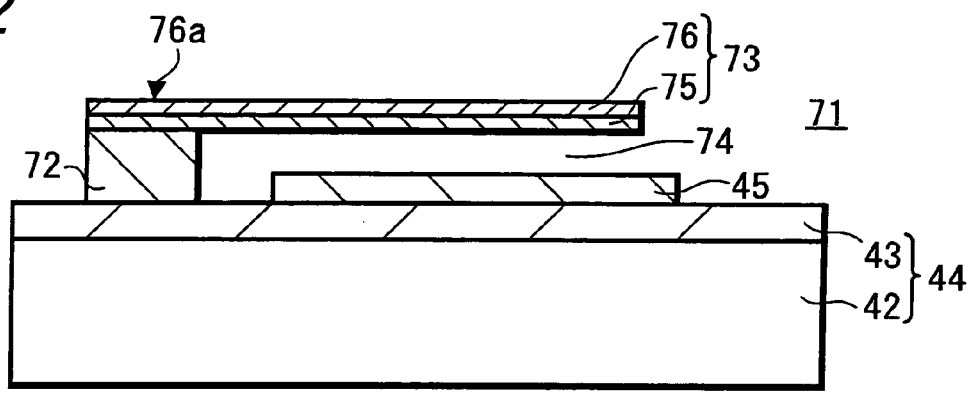
FIG. 2 is a structural diagram showing another typical embodiment of a MEMS device according to the present invention.

FIG. 2 shows another typical embodiment of an electrostatic drive type MEMS device according to the present invention. In this embodiment a beam is formed in a cantilever fashion.

A MEMS device 71 according to this embodiment is constructed as follows. In the same manner as mentioned before, a substrate with an insulation film formed on a semiconductor substrate or an insulative substrate, in this embodiment, a substrate 44 with an insulation film 43 formed on a semiconductor substrate 42 is used. A substrate side electrode 45 made of a single-crystalline semiconductor layer is formed on this substrate 44, and an electrostatic drive type beam 73, one end of which is supported by an insulative support part 72 is disposed so as to oppose the substrate side electrode 45. The substrate side electrode 45 and beam 73 are electrically insulated from each other by a void formed therebetween.

The beam 73 is composed of an insulation film 75 and a driving side electrode 76 thereupon. The insulative support part 72 can be formed of an insulative body, such as a silicon nitride (SiN) film, silicon oxide (SiO$_2$) film, or the like, in this embodiment, a silicon nitride (SiN) film.

Since the semiconductor substrate 42, the insulation film 43, the substrate side electrode 45, the insulation film 75 and the driving side electrode 76 constituting the beam 73, and the like have similar compositions and materials to those described in FIG. 1, so that the detailed explanation thereof will be omitted.

The MEMS device 71 can be manufactured by a similar process which is explained in the above FIGS. 4 to 5, FIGS. 6 to 7, or FIGS. 8 to 10.

That is, using the SOI substrate 51 or 61, after the substrate side electrode 45 is formed of, for example, a single-crystalline silicon layer of a single-crystalline semiconductor layer thereof, or after the substrate side electrode is formed of the epitaxial growth layer 69, the insulative support part 72 is formed through or not through the insulation film 56, the sacrificial layer 57 for forming a void is formed, followed by forming the beam 73 made of the insulation film 75 and driving side electrode 76 such that one end of the beam is supported by the insulative support part 72, and thereafter by removing the sacrificial layer 57, the MEMS device 71 can be manufactured.

With the MEMS device 71 according to this embodiment, in the same manner as mentioned above, the substrate side electrode 45 is formed of single-crystalline silicon layer, so that a surface 76a of the driving side electrode 76 of the beam 73 can be planarized. Therefore, when the MEMS device 71 is applied to an optical MEMS device, the beam in which the surface 76a of the driving side electrode 76 is planarized is obtained; and efficiencies in reflectance and diffraction of light are improved, thereby enabling reflected light to be utilized in high efficiency, and making it possible to implement improvements in the characteristics and performance of optical devices, such as a light switch capable of performing on-and-off control, a light modulation device to modulate the strength of light, and the like.

The above-mentioned MEMS devices 41, 71 can be applied to an optical MEMS device taking advantage of light reflection, and to an optical MEMS device taking advantage of light diffraction. In the case of taking advantage of the light reflection, it is possible to employ a composition in which one beam 46 or 73 is disposed so as to oppose the substrate side electrode 45, or a composition in which a plurality of beams 56 or 73, each of which is independently driven with respect to the common substrate side electrode 45, are disposed. In the case of taking advantage of the light diffraction, the optical MEMS device is composed of a plurality of beams 46 or 73 disposed in parallel with respect to the common substrate side electrode 45.

Using the above-mentioned optical MEMS devices, the light modulation device can be constructed.

According to the light modulation device of this embodiment, reflection efficiency and diffraction efficiency are improved, thereby enabling the reflected light to be utilized in high efficiency, and enabling characteristics and performance as the light modulation device to be improved.

Figure 11A:
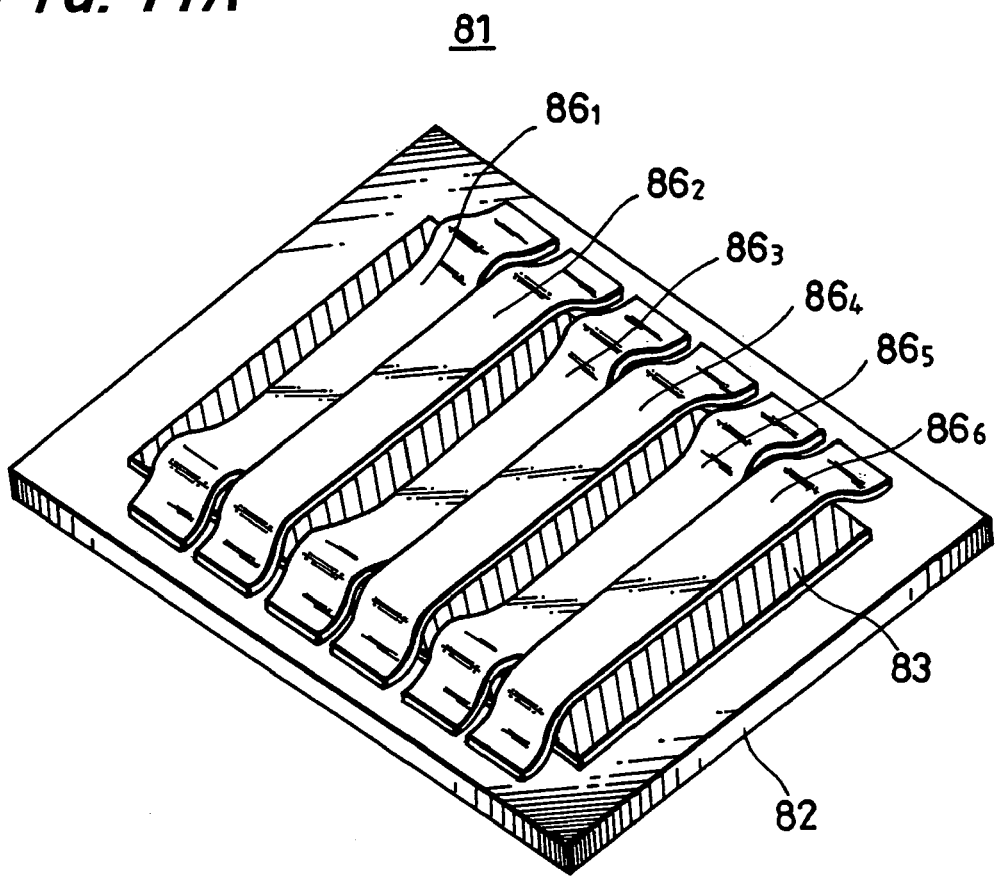
FIG. 11A is a structural diagram showing an embodiment of a GLV device according to the present invention.
Figure 11B:
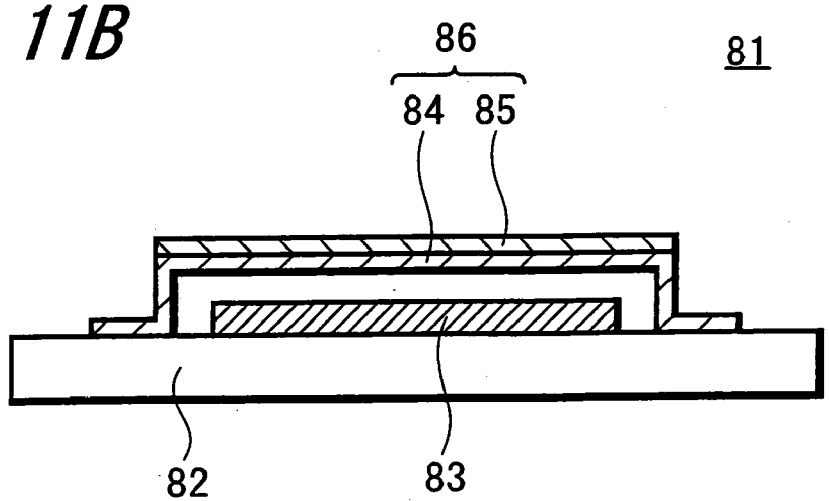
FIG. 11B is a cross-sectional view of FIG. 11A.

FIG. 11 shows an embodiment of a GLV device according to the present invention.

A GLV device 81 according to this embodiment can be composed in the following manner. In the same manner as explained in FIG. 1 mentioned above, a common substrate side electrode 83 made of a single-crystalline semiconductor layer, for example, single-crystalline silicon layer is formed on a substrate in which an insulation film is formed on a semiconductor substrate, or on an insulative substrate, in this embodiment, on a substrate 82 in which an insulation film is formed on a silicon single-crystalline substrate. A plurality of, in this embodiment, six beams 86 [$86_1$, $86_2$, $86_3$, $86_4$, $86_5$, $86_6$] composed of a laminated film of a bridge member 84 and a driving side electrode 85 formed of metal are disposed in parallel so as to oppose the common substrate side electrode 83.

As mentioned above, the GLV device 81 alternately varies the height of the driving side electrodes 85 functioning also as a light reflective film by the movement of every other beam 86, such as moving closer to or moving away from the substrate side electrode 83, and modulates the strength of light reflected on the driving side electrode 85 according to light diffraction.

This GLV device 81 can be manufactured by using the above-mentioned manufacturing methods shown in FIGS. 4 to 5, FIGS. 6 to 7, or FIGS. 8 to 10.

Since the GLV device 81 according to this embodiment is composed such that the substrate side electrode 83 is formed of single-crystalline semiconductor layer, for example, single-crystalline silicon layer, it is possible to resultantly improve the light reflectance of the mirror surface of the driving side electrodes 86 functioning also as a reflective film of the beams 86, and to provide the GLV device in which light is utilized in high efficiency and high performance thereof is obtained.

Figure 12:
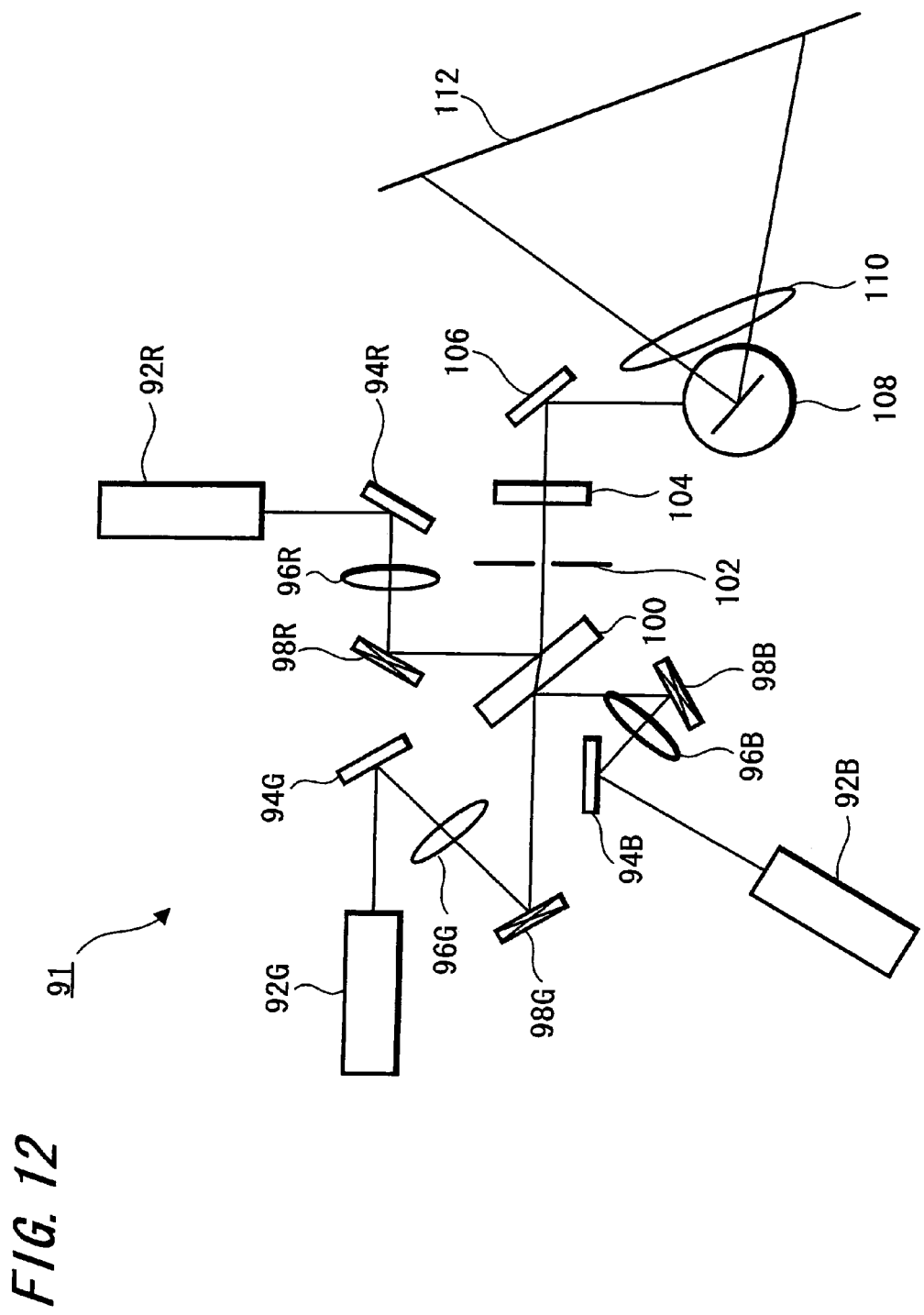
FIG. 12 is a constitutional diagram showing an embodiment of a laser display according to the present invention.
Figure 13:
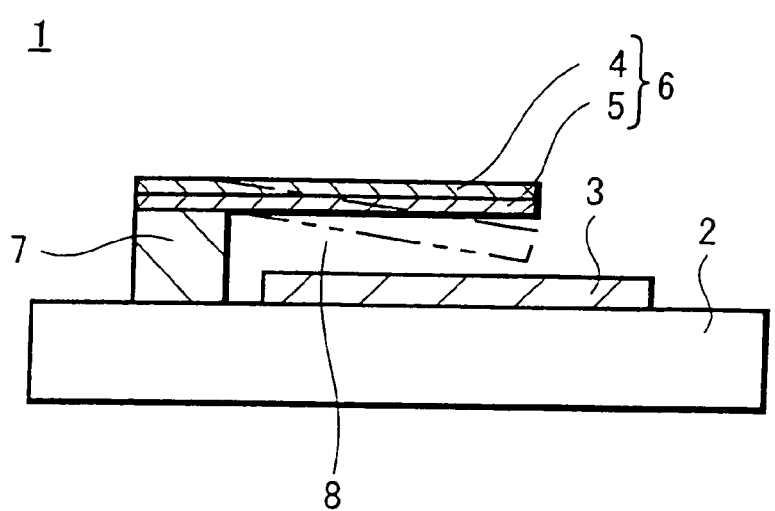
FIG. 13 is a typical example of an optical MEMS device for explaining a conventional art.
Figure 14:
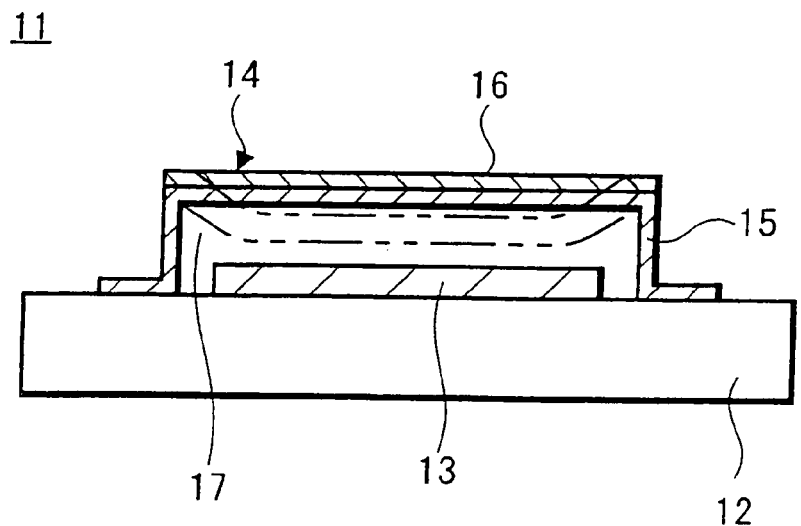
FIG. 14 is another typical example of an optical MEMS device for explaining a conventional art.
Figure 15A:
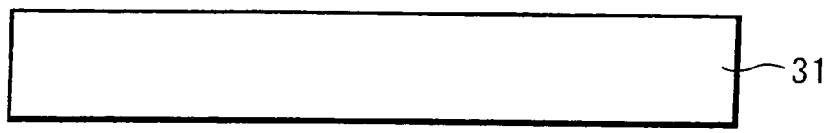
FIGS. 15A to 15E are diagrams showing an example of a manufacturing process (first sequence) of a conventional MEMS device in FIG. 14.
Figure 15B:
Figure 15C:
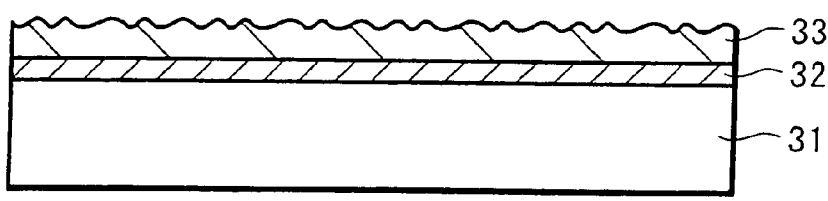
Figure 15D:
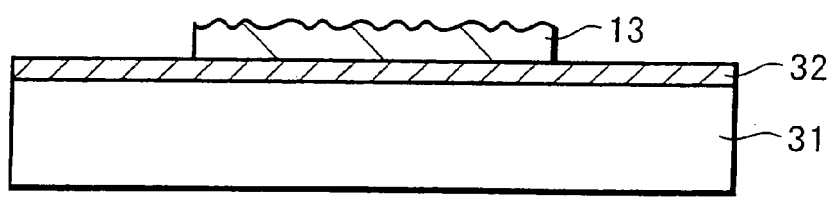
Figure 15E:
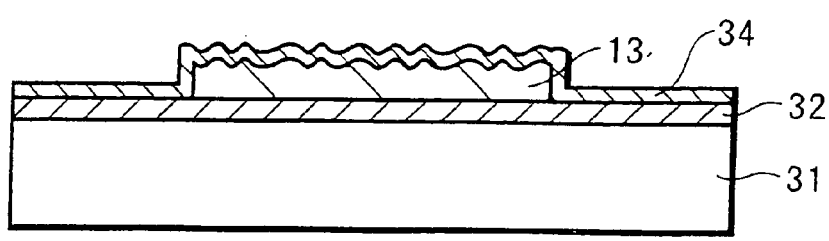
Figure 16A:
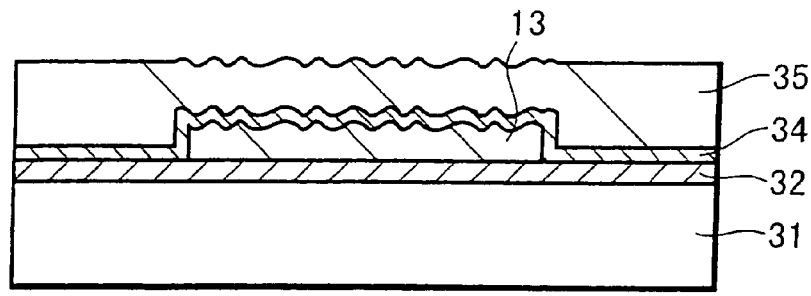
FIGS. 16A to 16D are diagrams showing the example of the manufacturing process (second sequence) of the conventional MEMS device in FIG. 14.
Figure 16B:
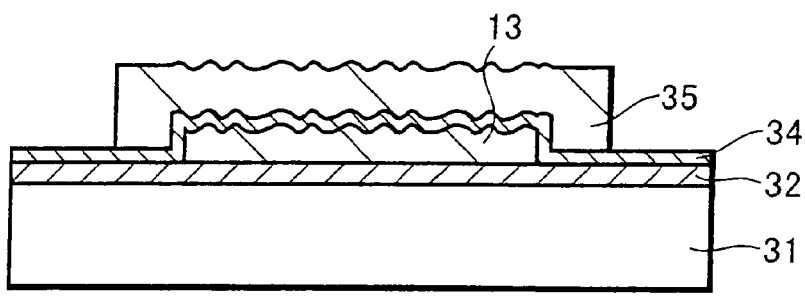
Figure 16C:
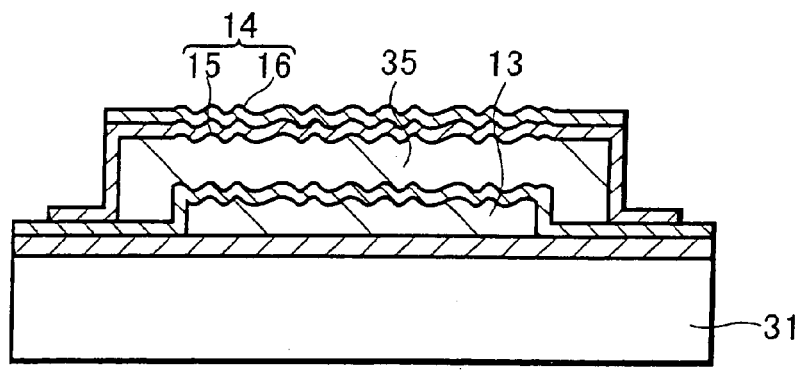
Figure 16D:
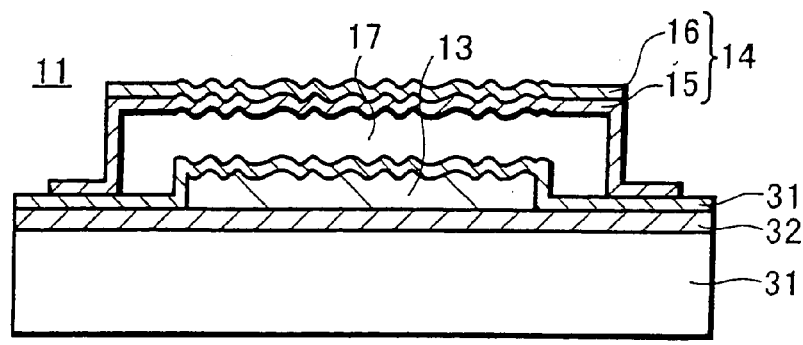
Figure 17A:
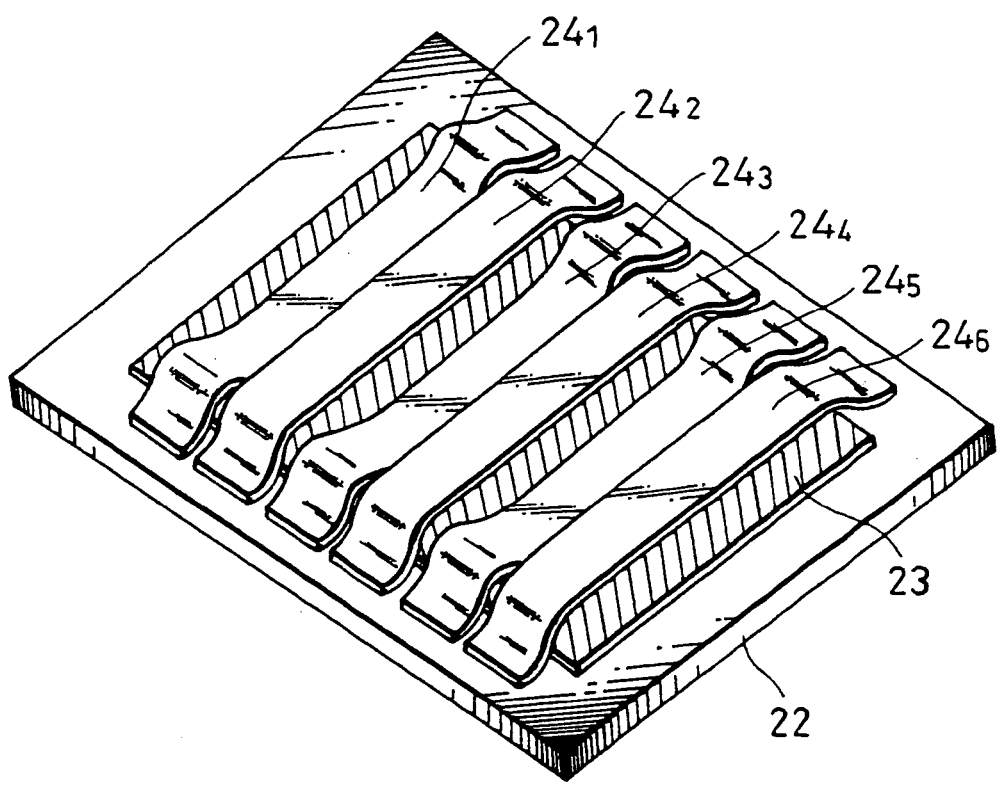
FIG. 17A is a structural diagram showing a conventional GLV device.
Figure 17B:
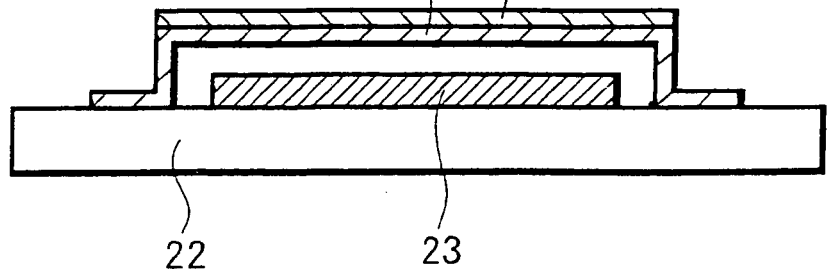
FIG. 17B is a cross-sectional view of the GLV device in FIG. 17A.
Figure 18:
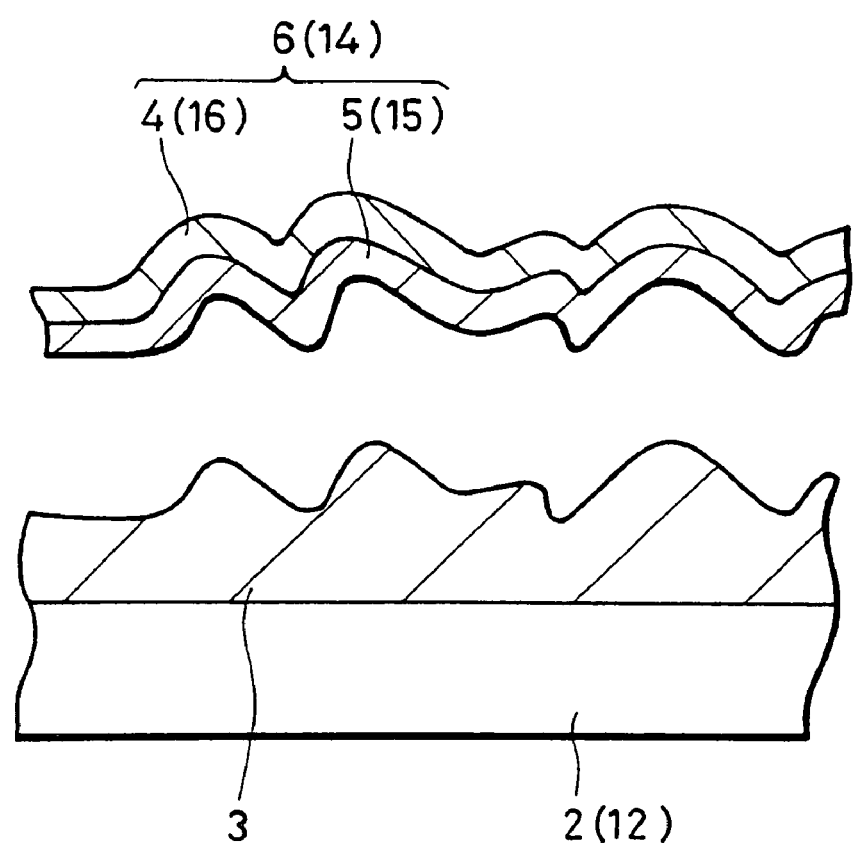
FIG. 18 is a cross-sectional view of a relevant part showing the unevenness of a driving side electrode of a conventional optical MEMS device.

FIG. 12 shows an embodiment of an optical apparatus using the GLV device as a light modulation device, to which the above-mentioned MEMS device is applied. In this embodiment, the GLV device is applied to a laser display.

A laser display 91 according to the embodiment is used as, for example, a projector for king-size screen, particularly, a projector for digital images, or an apparatus for projecting computer images.

The laser display 91 includes: as shown in FIG. 12, the laser light beam sources of 92R, 92G, 92B of respective colors red (R), green (G), blue (B); mirrors 94R, 94G, 94B sequentially provided on the optical axis of the respective sources of a laser light beam, respectively; respective illumination optical systems (a group of lenses) 96R, 96G, 96B; and GLV devices 98R, 98G, 98B functioning as a light modulation device.

The laser light beam sources of 92R, 92G, 92B respectively emit laser light beams of, for example, R (wavelength 642 nm, about 3 W optical power), G (wavelength 532 nm, about 2 W optical power), B (wavelength 457 nm, about 1.5 W optical power).

Further, the laser display 91 includes a color synthesizing filter 100 for synthesizing a red color (R) laser beam of light, green color (G) laser beam of light, and blue color (B) laser beam of light, the light strengths of which are respectively modulated by GLV devices 98R, 98G, 98B; a space filter 102; a diffuser 104; a mirror 106; a Galvano scanner 108; a projecting optical system (a group of lenses) 110; and a screen 112. The color synthesizing filter 100 is composed of, for example, a dichroic mirror.

In the laser display 91 according to this embodiment, respective RGB laser beams of light emitted from the laser light beam sources of 92R, 92G, 92G are incident on the respective GLV devices 98R, 98G, 98B from respective illumination optical systems 96R, 96G, 96B via each of the respective mirrors 94R, 94G, 94B. The respective laser beams of light are color-classified video signals, which are to be synchronously input to the GLV devices 98R, 98G, and 98B.

Further, respective laser beams of light are modulated with respect to space by being diffracted by the GLV devices 98R, 98G, 98B, and these three color diffracted beams of light are synthesized by the color synthesizing filter 100, and subsequently only signal components are derived by the space filter 102.

Next, the RGB video signals have laser speckles reduced by the diffuser 104, and via the mirror 106, the signals are spread into space by the Galvano scanner 108 synchronous to the signals so as to be projected onto the screen 112 as full color images by the projecting optical system 110.

Since the laser display 91 of this embodiment is provided with the. GLV devices 98R, 98G, 98B that have, as shown in FIG. 11, such a composition as a light modulation device, the light flux of video signals to be emitted improves in comparison with the laser display using a conventional light modulation device. As the light flux of signals improves, light-use efficiency of laser beams from the laser light beam sources of 92R, 92G, 92G improves.

The laser display 91 of this embodiment is provided with the GLV devices 98R, 98G, 98B corresponding to the respective color laser light beam sources 92, so that the GLV device according to the present invention is capable of being applied to various types of displays having other compositions than the above.

For example, while the light source is made to be a white color, the light modulation devices 98R, 98G, 98B, each of which has a different beam width, may compose one pixel to display respective colors by reflecting only light having each of the wavelengths of Red, Green, and Blue (other light is diffracted).

Further, it is possible to make a white color light from a single light source enter the GLV device 98 through a color wheel that synchronizes with picture information composed of RGB pixel data.

Furthermore, if light from LED (light-emitting diode) of RGB is diffracted using, for example, the single GLV device 98 to reproduce color information on every pixel, it becomes a simple handy-type color display.

In addition, the GLV device according to the present invention can be used not only as the kinds of projectors such as the laser display of this embodiment but as an optical switch for: various kinds of optical devices for transmitting WDM (Wavelength Division Multiplexing) in the optical communications, MUX (Multiplexer: parallel-serial transducer/distribution apparatus), or OADM (Optical Add/Drop Multiplexer), OXC (Optical Cross Connect) and the like.

Moreover, the GLV device according to the present invention can be applied to other optical apparatuses such as a microscopic drawing apparatus that can directly draw, for example, digital images and the like, a semiconductor exposure apparatus, a printer engine and the like.

Additionally, with the laser display 91 of the present invention, explanations have been made of the laser display that modulates with respect to space by using the GLV devices 98R, 98G, and 98B; however, the GLV device of the present invention can perform switching of information that can be modulated by interference and diffraction of a phase, the strength of light, and the like, and can be applied to optical appliances using thereof.

The invention claimed is:

1. A GLV device comprising:
  a first substrate;
  a common substrate side electrode; and
  a plurality of beams that are independently disposed in parallel to each other and that each have light reflective film cum driving side electrodes driven by electrostatic attraction force or electrostatic repulsion force that acts between the substrate side electrode and said driving side electrode, said substrate side electrode being formed of a single-crystalline semiconductor layer,
  wherein said substrate side electrode is formed on an insulated surface of the first substrate,
  wherein said plurality of beams are formed on the insulated surface of the first substrate, such that each beam straddles and is spaced apart from a top surface of said substrate side electrode, and
  wherein said substrate side electrode is an epitaxial growth layer that grows on the insulated surface of the first substrate.

2. The GLV device according to claim 1, wherein the common substrate side electrode is formed of a single crystalline semiconductor layer formed on the insulated surface of the first substrate.

3. The GLV device according to claim 1, wherein using an SOI substrate having a single-crystalline semiconductor layer on a semiconductor substrate through an insulation film, said common substrate side electrode is formed of said single-crystalline semiconductor layer.

4. A method for manufacturing a GLV device, comprising the steps of:
  forming a common substrate side electrode made of a single-crystalline semiconductor layer on an insulated surface of a first substrate;
  forming, selectively, a sacrificial layer including the upper part of said substrate side electrode through or not through an insulation film;

forming a plurality of beams having light reflection cum driving side electrodes disposed independently in parallel to each other on said sacrificial layer, such that each beam straddles and is spaced apart from a top surface of said substrate side electrode; and removing said sacrificial layer, wherein forming said common substrate side electrode includes growing an epitaxial growth layer on the insulated surface of said first substrate.

5. The method for manufacturing a GLV device according to claim 4, wherein using an SOI substrate having a single-crystalline semiconductor layer I on a semiconductor substrate through an insulation layer, said common substrate side electrode is formed of said single-crystalline semiconductor layer.

6. A laser display including a laser light beam source and a GLV device that is disposed on the optical axis of the laser light beam emitted from said laser light beam source and that modulates the strength of the laser light beam, wherein said GLV device comprises:

a first substrate;

a common substrate side electrode; and a plurality of beams that are independently disposed in parallel to each other to oppose said common substrate side electrode, wherein said common substrate side electrode has a light reflective film cum driving side electrode driven by electrostatic attraction force or electrostatic repulsion force that acts between the substrate side electrode and said driving side electrode, wherein said common substrate side electrode is formed of a single-crystalline semiconductor layer and is formed on an insulated surface of the first substrate, wherein said plurality of beams are formed on the insulated surface of the first substrate, such that each beam straddles and is spaced apart from a top surface of said substrate side electrode, and wherein said substrate side electrode is an epitaxial growth layer that grows on the insulated surface of the first substrate.

* * * * *